United States Patent
Dawson

(10) Patent No.: US 10,375,864 B2
(45) Date of Patent: Aug. 6, 2019

(54) AIRFLOW CONTROL IN DATA CENTERS UTILIZING HOT AISLE CONTAINMENT

(71) Applicant: Panduit Corp., Tinley Park, IL (US)

(72) Inventor: Bruce W. Dawson, Orland Park, IL (US)

(73) Assignee: Panduit Corp., Tinley Park, IL (US)

(*) Notice: Subject to any disclaimer, the term of this patent is extended or adjusted under 35 U.S.C. 154(b) by 0 days.

(21) Appl. No.: 15/670,275

(22) Filed: Aug. 7, 2017

(65) Prior Publication Data
US 2019/0045669 A1 Feb. 7, 2019

(51) Int. Cl.
*H05K 7/20* (2006.01)
(52) U.S. Cl.
CPC ..... *H05K 7/20836* (2013.01); *H05K 7/20736* (2013.01); *H05K 7/20745* (2013.01)
(58) Field of Classification Search
CPC .......... H05K 7/20836; H05K 7/20745; H05K 7/20736; H05K 7/2079; H05K 7/20763; H05K 7/20827; H05K 7/20754; H05K 7/20709; H05K 7/20145; H05K 7/20781; H05K 7/20281; H05K 7/20554; H05K 7/20809; H05K 7/202; H05K 5/0213; H05K 7/20136; H05K 7/20172; H05K 7/20718; H05K 7/20209; F24F 11/30; G06F 1/20; G06F 1/206; F25B 2700/1931; F25B 2700/1933
See application file for complete search history.

(56) References Cited

U.S. PATENT DOCUMENTS

| 4,817,865 | A | | 4/1989 | Wray |
| 5,040,377 | A | | 8/1991 | Braun et al. |
| 5,076,346 | A | * | 12/1991 | Otsuka ............... F24F 3/044 165/217 |
| 5,467,607 | A | | 11/1995 | Harvey |
| 5,474,120 | A | | 12/1995 | Severson et al. |
| 5,671,805 | A | | 9/1997 | Stahl et al. |
| 5,709,100 | A | | 1/1998 | Baer et al. |
| 5,826,432 | A | | 10/1998 | Ledbetter |

(Continued)

FOREIGN PATENT DOCUMENTS

| EP | 2770811 | 8/2014 |
| WO | 2011/073668 | 6/2011 |

OTHER PUBLICATIONS

EcoAisle Active Flow Controller User Manual, Schneider Electric, Oct. 2012.

(Continued)

*Primary Examiner* — Adam B Dravininkas
(74) *Attorney, Agent, or Firm* — Christopher S. Clancy; James H. Williams; Anthony Bartosik

(57) ABSTRACT

Examples disclosed herein relate to airflow control in data centers utilizing hot aisle containment. Consistent with some embodiments disclosed herein, a first differential pressure sensor may be located in a contained hot aisle in a data center and a second differential pressure sensor may be located in an above-ceiling hot air return plenum connected to the contained hot aisle. Pressure sensor data obtained from the differential pressure sensors may be used to maintain a near-neutral pressure in the contained hot aisle and a set negative pressure in the hot air return plenum.

8 Claims, 6 Drawing Sheets

(56) References Cited

U.S. PATENT DOCUMENTS

| | | | |
|---|---|---|---|
| 5,863,246 A * | 1/1999 | Bujak, Jr. | F24F 3/0442 |
| | | | 454/255 |
| 6,494,050 B2 | 12/2002 | Spinazzola et al. | |
| 6,557,624 B1 | 5/2003 | Stahl et al. | |
| 6,574,104 B2 | 6/2003 | Patel et al. | |
| 6,694,759 B1 | 2/2004 | Bash et al. | |
| 6,862,179 B2 | 3/2005 | Beitelman et al. | |
| 6,868,682 B2 | 3/2005 | Sharma et al. | |
| 6,925,828 B1 | 8/2005 | Gerstner et al. | |
| 7,251,547 B2 | 7/2007 | Bash et al. | |
| 7,313,924 B2 | 1/2008 | Bash et al. | |
| 7,418,825 B1 | 9/2008 | Bean, Jr. | |
| 7,861,596 B2 | 1/2011 | Bean, Jr. | |
| 7,971,446 B2 | 7/2011 | Clidaras et al. | |
| 8,145,363 B2 | 3/2012 | Bean, Jr. et al. | |
| 8,256,305 B2 | 9/2012 | Bean, Jr. et al. | |
| 8,523,643 B1 | 9/2013 | Roy | |
| 8,783,336 B2 * | 7/2014 | Slessman | F28F 9/0265 |
| | | | 165/121 |
| 8,908,368 B2 | 12/2014 | Campbell | |
| 8,914,155 B1 * | 12/2014 | Shah | H05K 7/20836 |
| | | | 700/19 |
| 9,204,578 B2 | 12/2015 | Smith | |
| 9,278,303 B1 * | 3/2016 | Somani | B01D 47/06 |
| 9,448,544 B2 | 9/2016 | Slessman et al. | |
| 9,661,788 B2 | 5/2017 | Slessman et al. | |
| 9,814,160 B2 * | 11/2017 | Slessman | H05K 7/20145 |
| 2006/0091229 A1 * | 5/2006 | Bash | H05K 7/20745 |
| | | | 236/49.3 |
| 2007/0125107 A1 * | 6/2007 | Beam | 62/186 |
| 2009/0277622 A1 | 11/2009 | Nair | |
| 2010/0216388 A1 | 8/2010 | Tresh et al. | |
| 2010/0317278 A1 * | 12/2010 | Novick | F24F 11/0001 |
| | | | 454/184 |
| 2011/0128699 A1 | 6/2011 | Heydari et al. | |
| 2011/0303406 A1 | 12/2011 | Takeda et al. | |
| 2012/0298219 A1 | 11/2012 | Bean, Jr. et al. | |
| 2013/0062047 A1 * | 3/2013 | Vaney | H05K 7/20745 |
| | | | 165/287 |
| 2014/0090806 A1 | 4/2014 | Colco et al. | |
| 2014/0244046 A1 | 8/2014 | Zhou et al. | |
| 2014/0330447 A1 * | 11/2014 | VanGilder | G05D 23/1917 |
| | | | 700/300 |
| 2016/0050797 A1 | 2/2016 | Smith | |
| 2016/0192543 A1 | 6/2016 | Matsuda et al. | |
| 2016/0324037 A1 * | 11/2016 | Dow | F24F 11/62 |
| 2017/0086333 A1 | 3/2017 | Roy | |

OTHER PUBLICATIONS

Airflow Pressure Controller & Rack Mounting Kit drawings, Schneider Electric, Apr. 19, 2013.

EcoAisle Intelligent Containment Solutions that Increase Data Center Cooling Efficiency while Protecting Critical IT Equipment and Personnel, Schneider Electric, Sep. 9, 2014.

* cited by examiner

AIRFLOW CONTROL IN DATA CENTERS UTILIZING HOT AISLE CONTAINMENT

BACKGROUND

Data centers set up for hot aisle containment enclose hot exhaust air produced by information technology (IT) equipment into contained "hot aisles". For data centers with row-level cooling systems, this hot exhaust air can be drawn directly into cooling units installed in the cabinet rows, and the airflow may be optimized through modulation of fan speeds within the row-level cooling units. For other cooling scenarios in hot aisle containment systems, the hot exhaust air may be ducted back to the cooling unit(s) via a hot air return plenum. The cooling units of a data center may draw in hot exhaust air from the hot air return plenum, cool the hot exhaust air, and provide the cooled air to the data center.

BRIEF DESCRIPTION OF THE DRAWINGS

The following detailed description references the drawings, wherein.

DETAILED DESCRIPTION

Figure 1:
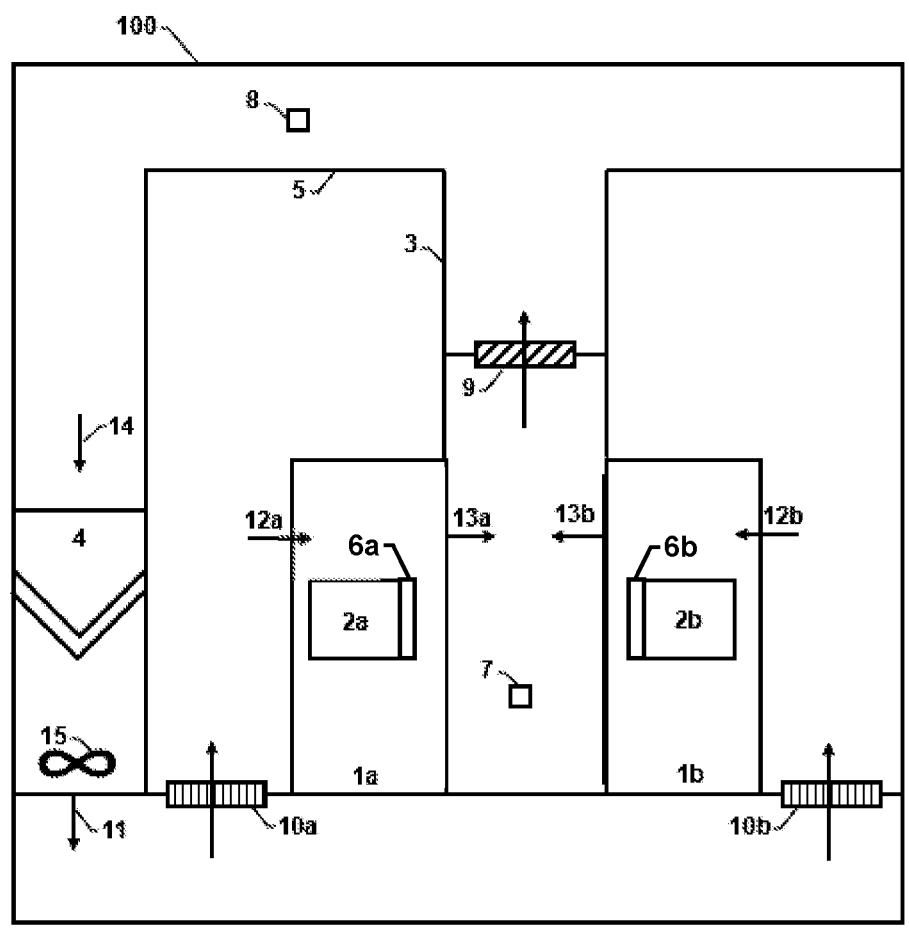
FIG. 1 is an illustration of an example implementation of a data center set up for hot aisle containment.

The cooling units in a data center may create a pressure differential as they take in hot exhaust air and expel cooled air. The pressure differential may manifest itself as a negative relative pressure between the cooled open environment of the data center and the hot air return plenum. The pressure in the contained hot aisles may be a function of the amount of cooled air pulled into the IT equipment by cooling fans within the IT equipment and the amount of hot exhaust air pulled from the contained hot aisles into the data center cooling units.

For example, if the cooling units pull less hot exhaust air from the contained hot aisles than the amount of cooled air pulled by the cooling fans across the IT equipment, the hot aisle pressure will become positive relative to the cooled data center space. The cooling fans of the IT equipment will see this as a resistance, which will result in a decrease in airflow through the IT equipment. The decrease in airflow will result in higher IT equipment operating temperatures, and the cooling fans will increase their fan speeds to combat the temperature increase.

Conversely, if the cooling units pull more hot exhaust air from the contained hot aisles than the amount of cooled air pulled by the cooling fans across the IT equipment, the hot aisle pressure will become negative relative to the cooled data center space. The cooling fans of the IT equipment will see this as assistance, which will result in an increase in airflow through the IT equipment. As a result, the cooling fans will pull more cooling air across the IT equipment than needed, resulting in an increase in operating costs.

Examples disclosed herein illustrate systems and methods for controlling airflow in data centers utilizing hot aisle containment. The disclosed systems and methods are capable of controlling the airflow such that a near-neutral pressure is maintained in the contained hot aisles while a set negative pressure is maintained in the hot air return plenum. In some implementations, pressure sensors may be positioned in the contained hot aisles and hot air return plenum. An active hot aisle containment (HAC) controller may monitor the pressure in the hot air return plenum using the pressure sensor(s) located therein, and may modulate the fans of the cooling unit(s) to maintain a set negative pressure therein. The active HAC controller may also monitor the pressures in the contained hot aisles using the pressure sensors located therein, and may modulate active damper ceiling panels in the contained hot aisles to maintain a near-neutral pressure in each contained hot aisle.

Reference will now be made to the accompanying drawings. Wherever possible, the same reference numbers are used in the drawings and the following description to refer to the same or similar parts. It is to be expressly understood, however, that the drawings are for illustration and description purposes only. While several examples are described in this document, modifications, adaptations, and other implementations are possible. Accordingly, the following detailed description does not limit the disclosed examples. Instead, the proper scope of the disclosed examples may be defined by the appended claims.

FIG. 1 is an illustration of an example implementation of a data center 100 set up for hot aisle containment. Data center 100 may be set up for hot aisle containment in that hot exhaust air produced by IT equipment is contained in ductwork, whereas the cooled air supplied to the IT equipment is provided in an open environment in data center 100.

Data center 100 may include IT equipment 2a, 2b housed in enclosures 1a, 1b. IT equipment 2a, 2b may include various types of IT equipment, such as servers, storage devices, networking devices, power supplies, etc. Enclosures 1a, and 1b may include various types of enclosures, such as racks, cabinets, etc.

During operation, IT equipment 2a, 2b may consume energy and, as a result, generate heat. In order to keep IT equipment 2a, 2b cooled, a cooling unit 4 may generate cooled air at 11, and may provide the cooled air to the open environment in data center 100 by using a blower 15 to blow the cooled air under a raised access floor and up through perforated floor tiles 10a, 10b in the floor. Cooling fans 6a, 6b in enclosures 1a, 1b may pull the cooled air from the open environment in data center 100 and pull or push the cooled air across IT equipment 2a, 2b to keep IT equipment 2a, 2b cooled.

As cooled air passes across IT equipment 2a, 2b, heat is exchanged from IT equipment 2a, 2b to the air. Enclosures 1a, 1b are arranged such that they define a contained hot aisle 3. Cooling fans 6a, 6b exhaust hot air at 13a, 13b out the rear of enclosures 1a, 1b directly into contained hot aisle 3. While enclosures 1a, 1b are labeled in FIG. 1, data center 100 may include additional enclosures housing IT equipment that are positioned adjacent to enclosures 1a, 1b such that they form two rows of enclosures. The rows may be positioned such that the backs of the enclosures in one row face the backs of the enclosures in the other row, and the contained hot aisle 3 is formed between the backs of enclosures. In some other implementations, contained hot aisle 3 may be formed by a single row of enclosures opposite a wall or other structure that encloses the hot aisle in place of a second row of enclosures.

Hot aisle 3 is "contained" in that hot exhaust air traveling in hot aisle 3 is prevented from mixing with the conditioned air in the open environment of data center 100. Contained hot aisle 3 may extend vertically until it intersects with a hot air return plenum 5 above a suspended ceiling in data center 100. Contained hot aisle 3 may receive the hot exhaust air directly from enclosures 1a, 1b at 13a, 13b, and may provide the hot exhaust air to cooling unit 4 via hot air return plenum 5. The hot exhaust air may travel vertically through contained hot aisle 3 to hot air return plenum 5, which may be positioned above a suspended ceiling in data center 100. Cooling unit 4 may draw the hot exhaust air out of hot air return plenum 5 at 14 and may cool the hot exhaust air so that the cooled air may continue to cool IT equipment 2a, 2b in steady state operation.

As alluded to above, various portions of data center 100 may be at different pressures during steady state operation of the cooling system. To ensure efficient airflow of data center 100, the various pressures may be monitored and controlled. For example, a differential pressure sensor 7 may be included in contained hot aisle 3 to monitor the pressure therein. Similarly, a differential pressure sensor 8 may be included in hot air return plenum 5 to monitor the pressure therein. Differential pressure sensors 7 and 8 may provide pressure data to an active HAC controller (not shown), which may adjust various parameters and devices in data center 100 to control the pressures therein.

In some implementations, the active HAC controller may use pressure sensor data from differential pressure sensor 7 to maintain a near-neutral pressure in hot aisle 3 to ensure that cooling fans 6a, 6b move an efficient amount of cooled air over IT equipment 2a, 2b. To maintain a near-neutral pressure, the active HAC controller may modulate damper 9 (i.e., by adjusting the amount that damper 9 is open or closed) based on the pressure sensor data received from differential pressure sensor 7. Damper 9 may be various types of dampers, such as an active damper ceiling panel.

Differential pressure sensor 7 may be located anywhere in contained hot aisle 3 below damper 9. In some implementations, to get a more accurate differential pressure reading in contained hot aisle 3, differential pressure sensor 7 may be located lower in contained hot aisle 3, such as near the bottom, so as to minimize the air velocity across differential pressure sensor 7.

In some implementations, the active HAC controller may use pressure sensor data from differential pressure sensor 8 to maintain a set or specified negative pressure in hot air return plenum 5. To maintain a set negative pressure, the active HAC controller may modulate fan 15 of cooling unit 4 (i.e., by increasing or decreasing the fan speed of fan 15) based on the pressure sensor data received from differential pressure sensor 8.

Figure 2:
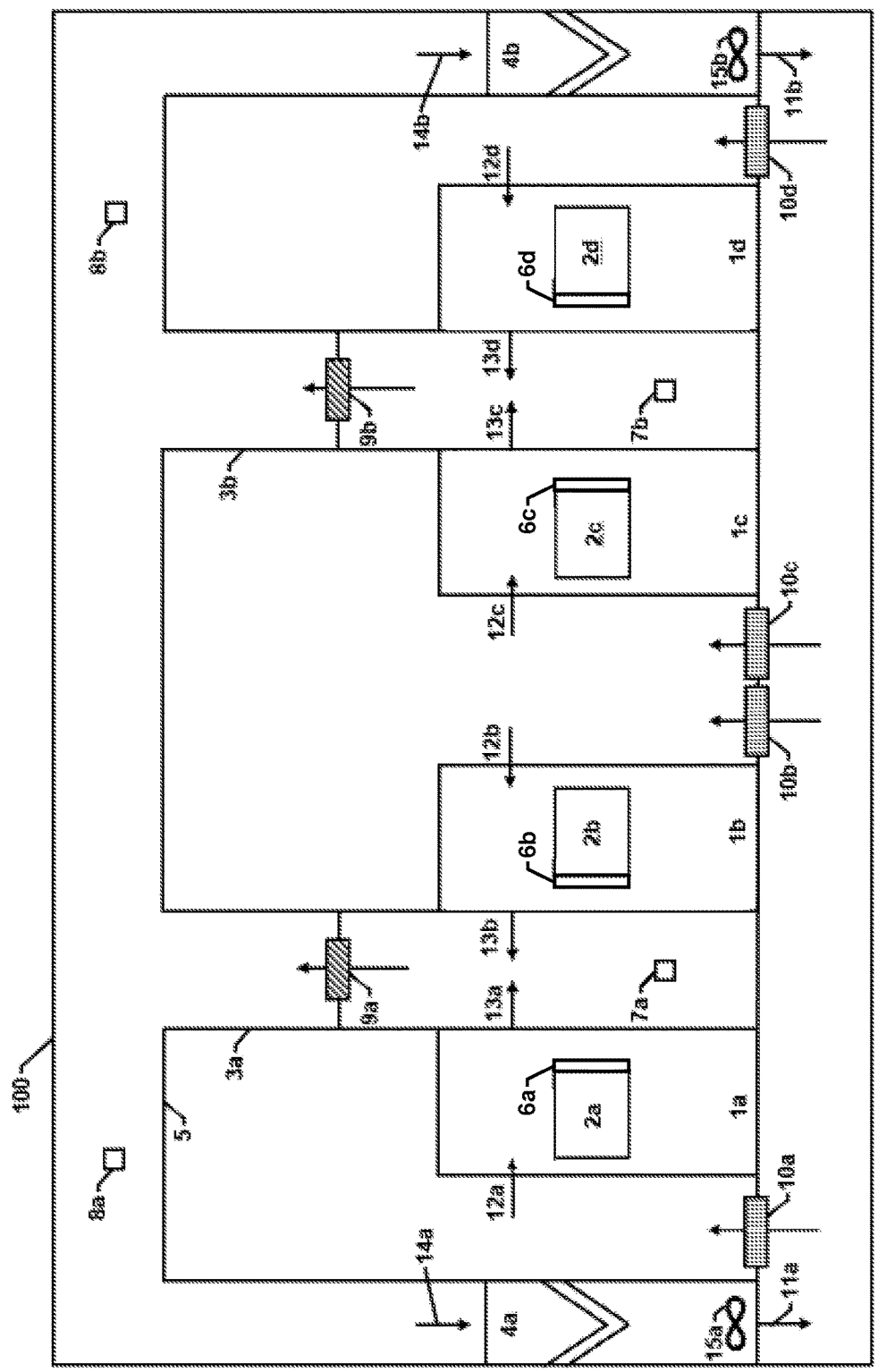
FIG. 2 is an illustration of an example implementation of a data center set up for hot aisle containment.

FIG. 2 is an illustration of another example implementation of data center 100 set up for hot aisle containment. Data center 100 may be set up similar to the implementation illustrated in FIG. 1, except that data center 100 has been expanded to include additional IT equipment 2c, 2d housed in enclosures 1c, 1d, and an additional cooling unit 4b. FIG. 2 is an example implementation only. Indeed, the principles of operation of data center 100 described herein may be expanded to include any number of contained hot aisles, IT equipment, enclosures, cooling units, etc.

Enclosures 1c, 1d, may be configured similarly to enclosures 1a, 1b in that they are arranged to define a contained hot aisle 3b. Contained hot aisles 3a, 3b may direct hot exhaust air from IT equipment 2a-2d up to hot air return plenum 5. Hot air return plenum 5 may provide the hot exhaust air to cooling units 4a, 4b, which may cool the hot exhaust air, provide the cooled air at 11a, 11b using fans 15a, 15b to the open environment of data center 100 through perforated floor tiles 10a-10d via a raised access floor. Cooling fans 6a-6d in enclosures 1a-1d may pull the cooled air from the open environment in data center 100 and pull or push cooled air across IT equipment 2a-2d to keep IT equipment 2a-2d cooled.

To monitor and control the various pressures in the expanded version of data center 100, a differential pressure sensor may be included in each contained hot aisle. As shown in FIG. 2, differential pressure sensor 7a may be included in contained hot aisle 3a and differential pressure sensor 7b may be included in contained hot aisle 3b. The active HAC controller (not shown in FIG. 2) may use pressure sensor data from differential pressure sensors 7a, 7b to respectively maintain near-neutral pressures in contained hot aisles 3a, 3b by modulating dampers 9a, 9b based on the received data.

One or more differential pressure sensors may be included in hot air return plenum 5 to monitor and control the pressure therein. When one differential pressure sensor is included in hot air return plenum 5, it may be located in the portion of hot air return plenum 5 between contained hot aisles 3a, 3b.

When a plurality of differential pressure sensors (i.e., differential pressure sensors 8a, 8b) are included in hot air return plenum 5, differential pressure sensor 8a may be positioned between contained hot aisle 3a and cooling unit 4a, and differential pressure sensor 8b may be positioned between contained hot aisle 3b and cooling unit 4b. The active HAC controller may use pressure sensor data from differential pressure sensor 8a to modulate the fan speed of fan 15a, and may use pressure sensor data from differential pressure sensor 8b to modulate the fan speed of fan 15b. Fans 15a, 15b may be modulated to maintain a set negative pressure in hot air return plenum 5.

Figure 3:
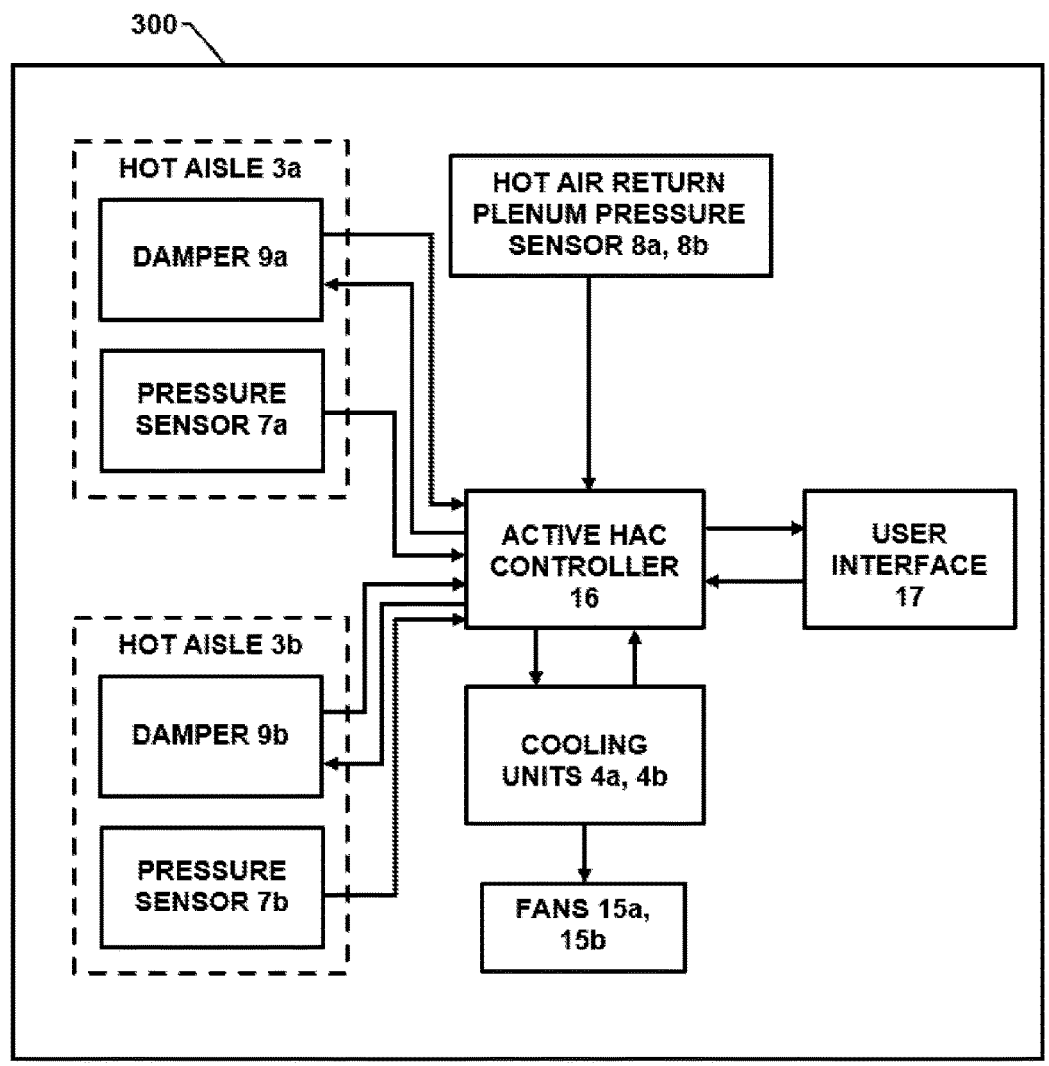
FIG. 3 is an illustration of an example cooling system for controlling airflow in a data center set up for hot aisle containment.

FIG. 3 is an illustration of an example block diagram of a cooling system 300 for use in the various implementations of data center 100 described above. As shown in FIG. 3, cooling system 300 may include an active HAC controller 16 connected to a plurality of dampers 9a, 9b, differential pressure sensors 7a, 7b, 8a, 8b, and a plurality of cooling units 4a, 4b. FIG. 3 is an example only, and the principles of operation of cooling system 300 described herein may be expanded to include any number of the described components or other components. The example configuration of cooling system 300 shown in FIG. 3 may be used with the implementation of data center 100 illustrated in FIG. 2 above. However, the number of components may be reduced so that it can be used with the implementation of data center 100 illustrated in FIG. 1 above. In such an implementation, active HAC controller would be connected to a single damper 9, differential pressure sensors 7, 8, and a single cooling unit 4.

In some implementations, active HAC controller 16 may be implemented by various hardware electronic controllers (e.g., microcontrollers, processors, application specific integrated circuits (ASICs), etc.). In some implementations, active HAC controller 16 may be implemented by a combination of hardware executing software in the form instructions. The hardware may execute the instructions to perform the functions of active HAC controller 16 described herein.

Cooling system 300 may also include a user interface (UI) 17. UI 17 may be a graphical user interface (GUI) that allows users to view the operational parameters of data center 100 and cooling system 300, and to make changes to the operation of data center 100 and cooling system 300. For example, a user may, by providing input via UI 17, change or modify the specified pressures of contained hot aisles 3a, 3b and hot air return plenum 5.

Figure 4:
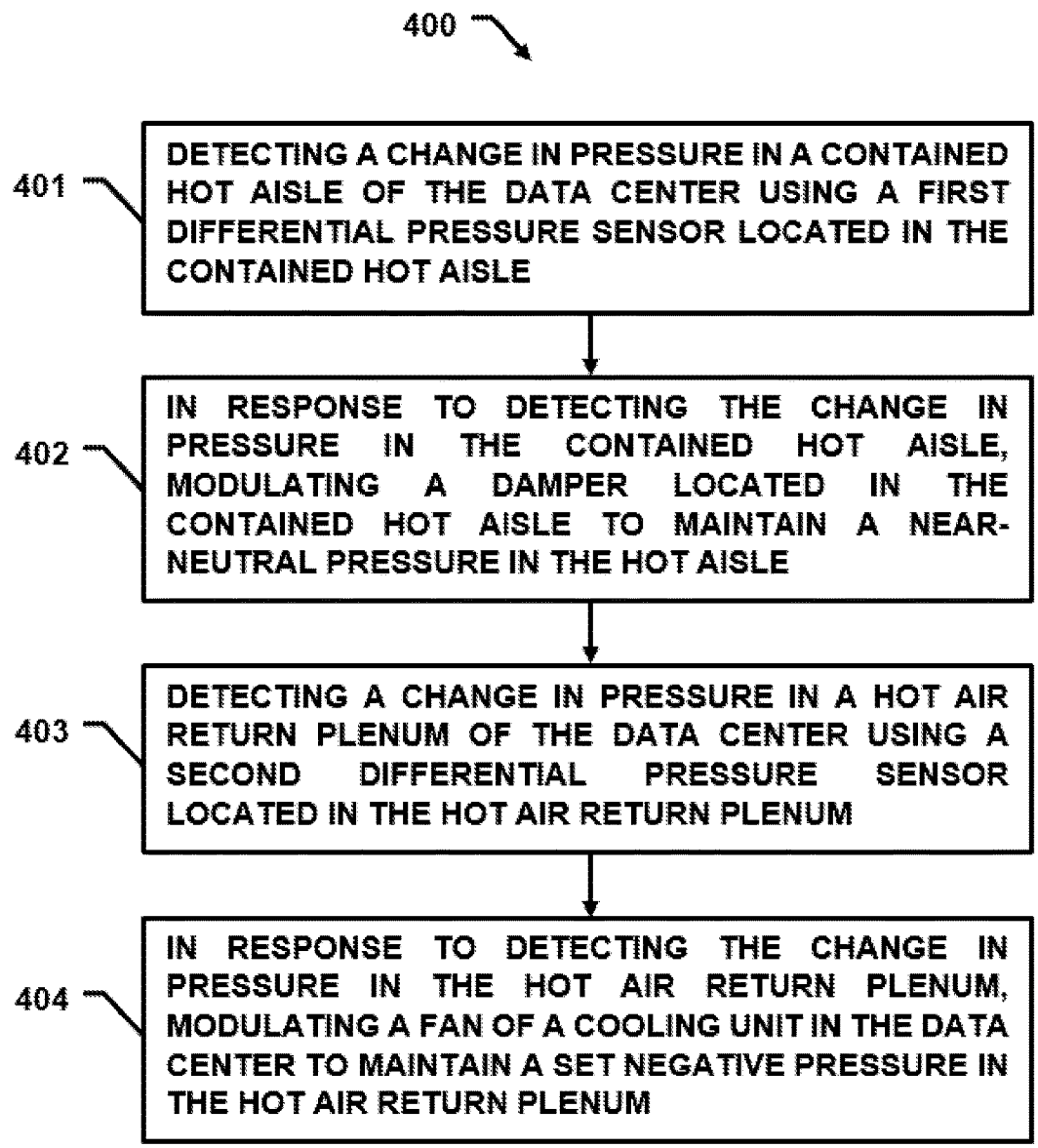
FIG. 4 is a flowchart of an example method for airflow control in a data center utilizing hot aisle containment.

FIG. 4 is a flowchart depicting an example method 400 for controlling airflow in a data center utilizing hot aisle containment such as data center 100 of FIGS. 1 and 2. Method 400 may be executed or performed by some or all of the system components described above in data center 100 of FIGS. 1 and 2, and/or cooling system 300 of FIG. 3. For example, method 400 may be executed or performed by active HAC controller 16 of FIG. 3. In some implementations, steps of method 400 may be executed substantially concurrently or in a different order than shown in FIG. 4, and more or less steps may be performed than shown. In some implementations, some of the steps of method 400, or method 400 in general, may, at certain times, be ongoing and/or may repeat.

At block 401, with the data center cooling system operating in a steady state, method 400 may include detecting a change in pressure in a contained hot aisle of the data center using a first differential pressure sensor located in the contained hot aisle. The change in pressure may be detected based on pressure sensor data received from the differential pressure sensor. The change in pressure may result from, for example, the IT equipment in the data center requiring more or less cooling, and thus increasing or decreasing the cooling fan speed of the cooling fans used to cool IT equipment. As the cooling fan speed changes, the amount of hot exhaust air exhausted into the contained hot aisle also changes, thereby change the pressure in the contained hot aisle.

At block 401, method 400 may include modulating a damper located in the contained hot aisle to maintain a near-neutral pressure in the hot aisle in response to detecting the change in pressure in the contained hot aisle.

At block 403, method 400 may include detecting a change in pressure in a hot air return plenum of the data center using a second differential pressure sensor located in the hot air return plenum. The change in pressure may be detected based on pressure sensor data received from the differential pressure sensor in the hot air return plenum. The change in pressure may result from, for example, the active HAC controller modulating the damper located in the contained hot aisle to maintain the near-neutral pressure in the hot aisle.

At block 404, method 400 may include modulating a fan of a cooling unit in the data center to maintain a set negative pressure in the hot air return plenum in response to detecting the change in pressure in the hot air return plenum. In some implementations, a plurality of differential pressure sensors may be included in the hot air return plenum to monitor and control the pressure therein, such as those where a plurality of cooling units is included in the data center. In such implementations, each differential pressure sensor may be dedicated to controlling the fan speed of one of the cooling unit fans.

Method 400 may continue to iterate through blocks 401-404 until a new steady state condition is achieved.

Figure 5:
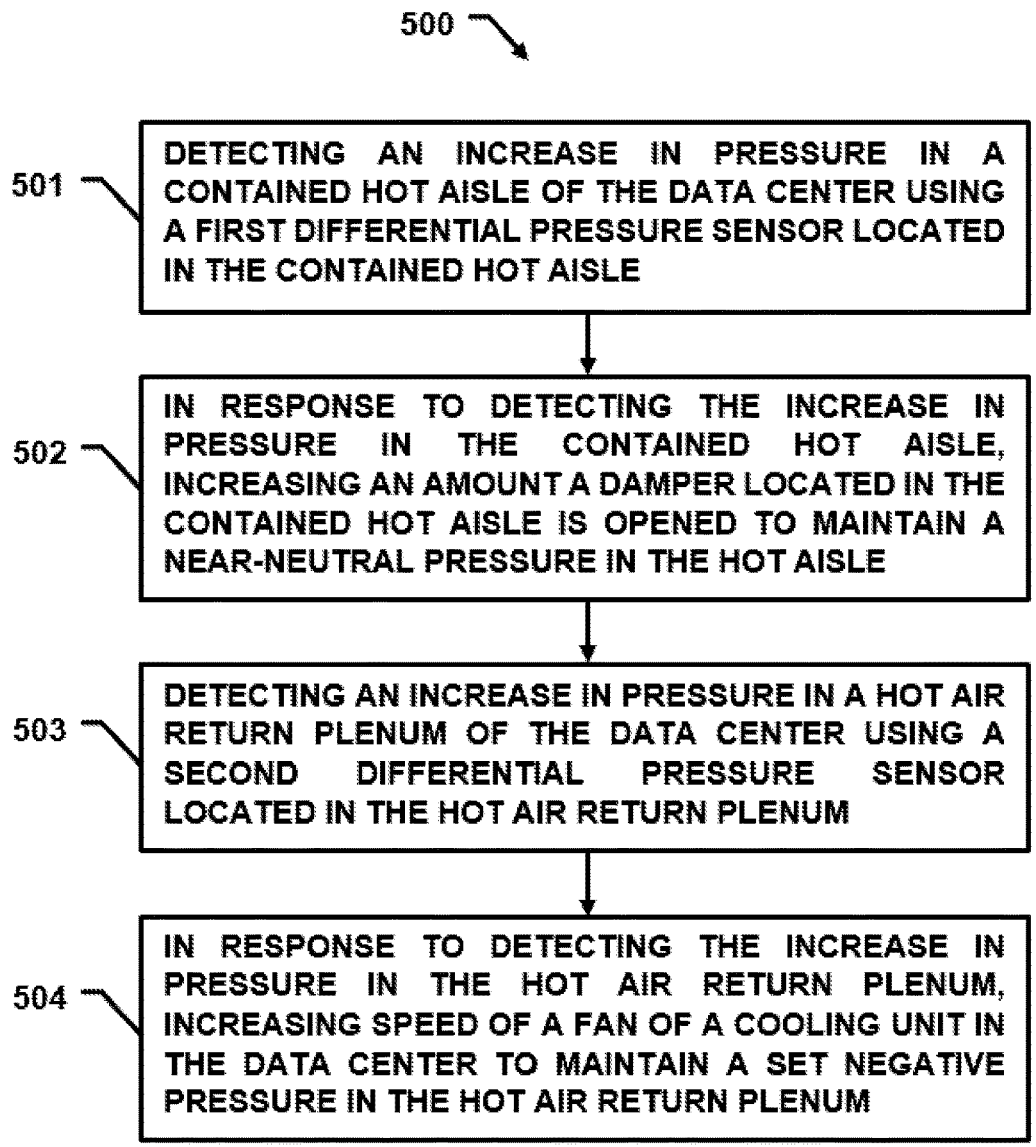
FIG. 5 is a flowchart of an example method for airflow control in a data center utilizing hot aisle containment.

FIG. 5 is a flowchart depicting an example method 500 for controlling airflow in a data center utilizing hot aisle containment such as data center 100 of FIGS. 1 and 2. Method 500 may be executed or performed by some or all of the system components described above in data center 100 of FIGS. 1 and 2, and/or cooling system 300 of FIG. 3. For example, method 500 may be executed or performed by active HAC controller 16 of FIG. 3. In some implementations, method 500 may be a specific example implementation of method 400 of FIG. 4 above.

At block 501, with the data center cooling system operating in a steady state, method 500 may include detecting an increase in pressure in a contained hot aisle of the data center using a first differential pressure sensor located in the contained hot aisle. The increase in pressure may be detected based on pressure sensor data received from the differential pressure sensor.

At block 502, method 500 may include increasing an amount a damper located in the contained hot aisle is opened in order to maintain a near-neutral pressure in the hot aisle in response to detecting the increase in pressure in the contained hot aisle.

At block 503, method 500 may include detecting an increase in pressure in a hot air return plenum of the data center using a second differential pressure sensor located in the hot air return plenum. The increase in pressure may be detected based on pressure sensor data received from the differential pressure sensor in the hot air return plenum. The increase in pressure may result from, for example, the active HAC controller opening the damper located in the contained hot aisle further to maintain the near-neutral pressure in the hot aisle.

At block 504, method 500 may include increasing a fan speed of a fan of a cooling unit in the data center to maintain a set negative pressure in the hot air return plenum in response to detecting the increase in pressure in the hot air return plenum.

Figure 6:
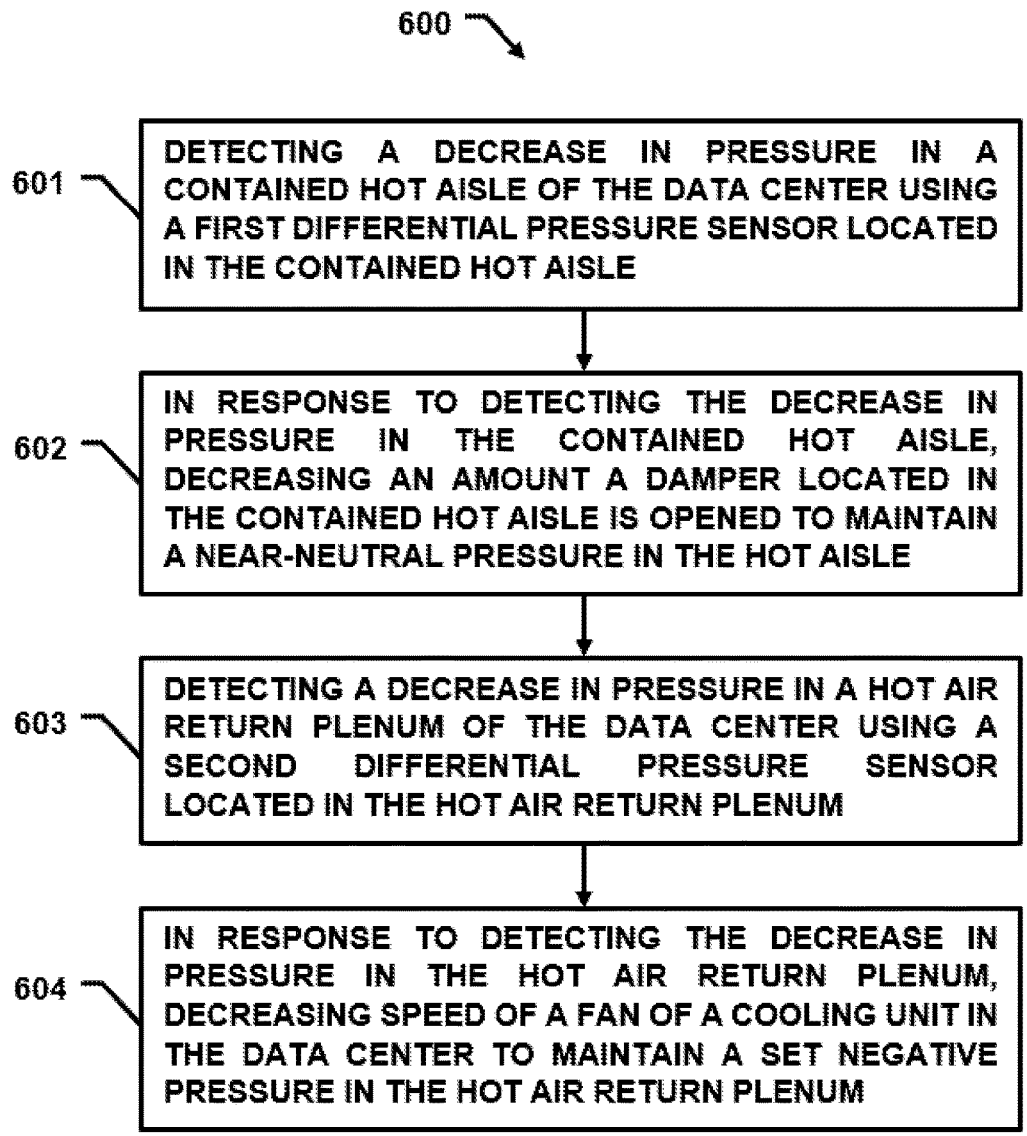
FIG. 6 is a flowchart of an example method for airflow control in a data center utilizing hot aisle containment.

FIG. 6 is a flowchart depicting an example method 600 for controlling airflow in a data center utilizing hot aisle containment such as data center 100 of FIGS. 1 and 2. Method 600 may be executed or performed by some or all of the system components described above in data center 100 of FIGS. 1 and 2, and/or cooling system 300 of FIG. 3. For example, method 600 may be executed or performed by active HAC controller 16 of FIG. 3. In some implementations, method 600 may be a specific example implementation of method 400 of FIG. 4 above.

At block 601, with the data center cooling system operating in a steady state, method 600 may include detecting a decrease in pressure in a contained hot aisle of the data center using a first differential pressure sensor located in the contained hot aisle. The decrease in pressure may be detected based on pressure sensor data received from the differential pressure sensor.

At block 602, method 600 may include decreasing an amount a damper located in the contained hot aisle is opened in order to maintain a near-neutral pressure in the hot aisle in response to detecting the decrease in pressure in the contained hot aisle.

At block 603, method 600 may include detecting a decrease in pressure in a hot air return plenum of the data center using a second differential pressure sensor located in the hot air return plenum. The decrease in pressure may be detected based on pressure sensor data received from the differential pressure sensor in the hot air return plenum. The decrease in pressure may result from, for example, the active HAC controller reducing the opening the damper located in the contained hot aisle to maintain the near-neutral pressure in the hot aisle.

At block 604, method 600 may include decreasing a fan speed of a fan of a cooling unit in the data center to maintain a set negative pressure in the hot air return plenum in response to detecting the decrease in pressure in the hot air return plenum.

Note that while the present disclosure includes various embodiments, these embodiments are non-limiting (regardless of whether they have been labeled as exemplary or not), and there are alterations, permutations, and equivalents, which fall within the scope of this invention. Additionally, the described embodiments should not be interpreted as mutually exclusive, and should instead be understood as potentially combinable if such combinations are permissive. It should also be noted that there are many alternative ways of implementing the embodiments of the present disclosure. It is therefore intended that claims that may follow be interpreted as including all such alterations, permutations, and equivalents as fall within the true spirit and scope of the present disclosure.

The invention claimed is:

1. A portion of a data center utilizing hot aisle containment, comprising:
   at least one row of enclosures housing IT equipment, backs of the enclosures facing a contained hot aisle into which the IT equipment exhausts hot air;
   a first differential pressure sensor located in the contained hot aisle;
   an active damper located in the contained hot aisle above the first differential pressure sensor;
   the contained hot aisle extending vertically upward and connecting to a hot air return plenum located in a suspended ceiling of the data center;
   a second differential pressure sensor located in the hot air return plenum;
   a cooling unit connected to the hot air return plenum; and
   an active hot aisle containment (HAC) controller to:
      maintain a near-neutral pressure in the contained hot aisle by modulating the active damper based on pressure sensor data received from the first differential pressure sensor;
      maintain a set negative pressure in the hot air return plenum based on pressure sensor data received from the second differential pressure sensor;
      increase an amount the active damper is opened in response to detecting an increase in pressure in the contained hot aisle using the first differential pressure sensor; and
      decrease the amount the active damper is opened in response to detecting a decrease in pressure in the contained hot aisle using the first differential pressure sensor.

2. The portion of the data center of claim 1, wherein:
   the cooling unit includes a fan; and
   the active HAC controller is to maintain the set negative pressure in the hot air return plenum by modulating the fan in the cooling unit based on pressure sensor data received from the second differential pressure sensor.

3. The portion of the data center of claim 2, wherein the active HAC controller is to:
   increase a fan speed of the fan in the cooling unit in response to detecting an increase in pressure in the hot air return plenum using the second differential pressure sensor; and
   decrease the fan speed of the fan in the cooling unit in response to detecting a decrease in pressure in the hot air return plenum using the second differential pressure sensor.

4. A data center cooling system, comprising:
   a first differential pressure sensor located in a first contained hot aisle;
   a second differential pressure sensor located in an above-ceiling hot air return plenum connected to the first contained hot aisle;
   a first active damper ceiling panel located in the first contained hot aisle;
   a third differential pressure sensor located in a second contained hot aisle;
   a second active damper located in the second contained hot aisle;
   a cooling unit connected to the hot air return plenum; and
   an active hot aisle containment (HAC) controller to:
      modulate the first active damper to maintain a near-neutral pressure in the first contained hot aisle based on pressure sensor data received from the first differential pressure sensor; and
      modulate a fan in the cooling unit to maintain a set negative pressure in the hot air return plenum based on pressure sensor data received from the second differential pressure sensor.

5. The data center cooling system of claim 4, wherein the active HAC controller is to:
   modulate the second active damper to maintain a near-neutral pressure in the second contained hot aisle based on pressure sensor data received from the third differential pressure sensor.

6. The data center cooling system of claim 4, wherein the cooling system comprises:
   a second cooling unit connected to the hot air return plenum.

7. The data center cooling system of claim 6, wherein the active HAC controller is to:
   modulate the fan in the cooling unit and a second fan in the second cooling unit to maintain a set negative pressure in the hot air return plenum based on pressure sensor data received from the second differential pressure sensor.

8. The data center cooling system of claim 7, wherein:
   the cooling system comprises a fourth differential pressure sensor located in the hot air return plenum; and
   the active HAC controller is to:
      modulate the fan in the cooling unit to maintain a set negative pressure in the hot air return plenum based on pressure sensor data received from the second differential pressure sensor; and
      modulate the second fan in the second cooling unit to maintain a set negative pressure in the hot air return plenum based on pressure sensor data received from the fourth differential pressure sensor.

* * * * *